(12) United States Patent
Pividori et al.

(10) Patent No.: US 6,458,659 B1
(45) Date of Patent: Oct. 1, 2002

(54) METHOD OF FABRICATING NON-VOLATILE MEMORY DEVICES INTEGRATED IN A SEMICONDUCTOR SUBSTRATE AND ORGANIZED INTO MEMORY MATRICES

(75) Inventors: Luca Pividori, Curno; Lidia Brusaferri, Villasanta, both of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/575,331

(22) Filed: May 19, 2000

(30) Foreign Application Priority Data

May 21, 1999 (IT) .......................... MI99A1130

(51) Int. Cl.$^7$ .......................................... H01L 21/8247
(52) U.S. Cl. ....................................................... 438/258
(58) Field of Search .................................. 438/257–267

(56) References Cited

U.S. PATENT DOCUMENTS 5,911,105 A  *  6/1999  Sasaki ........................ 438/258
5,933,730 A  *  8/1999  Sun et al. ................... 438/258
6,258,667 B1 *  7/2001  Huang ......................... 438/258

* cited by examiner

Primary Examiner—Richard Booth
(74) Attorney, Agent, or Firm—Lisa K. Jorgenson; Brian L. Johnson; Seed IP Law Group PLLC

(57) ABSTRACT

A method of fabricating non-volatile memory devices integrated in a semiconductor substrate is presented. The memory devices include a matrix of non-volatile memory cells, each having floating-gate MOS transistors with associated gate electrodes, as well as control circuitry formed of MOS transistors also having gate electrodes. The method includes forming gate electrodes above the substrate, then depositing a first dielectric layer onto the entire exposed surface. Next the first dielectric layer is etched back to form isolating spacers on the side walls of the gate electrodes of the matrix cells. Then a second dielectric layer is deposited onto the entire exposed surface, and the memory matrix is overlaid with a protective layer. In the circuitry area, the second dielectric layer is etched back to form isolating spacers on the side walls of the gate electrodes of the circuitry transistors, while the floating-gate MOS transistors are protected.

16 Claims, 3 Drawing Sheets

US 6,458,659 B1

METHOD OF FABRICATING NON-VOLATILE MEMORY DEVICES INTEGRATED IN A SEMICONDUCTOR SUBSTRATE AND ORGANIZED INTO MEMORY MATRICES

TECHNICAL FIELD

This invention relates to an improved method of fabricating non-volatile memory devices integrated in a semiconductor substrate and organized into memory matrices.

BACKGROUND OF THE INVENTION

Non-volatile memory devices integrated in a semiconductor substrate include matrices of memory cells, with each cell comprising at least one floating-gate MOS transistor and control circuitry made from fast-logic MOS transistors.

Each floating-gate MOS transistor conventionally includes a drain region and a source region which are formed in the semiconductor substrate and separated by a channel region. A floating gate electrode is provided above the substrate and separated from the substrate by a thin layer of gate oxide.

A control electrode is coupled capacitively to the floating gate electrode through a dielectric layer.

Considerable effort has been devoted in recent years to reducing the size of memory devices. These devices are presently fabricated using submicron technology processes.

These devices are often provided with isolating spacers on the side walls of the individual gate electrodes, which spacers allow the source/drain regions of the transistors provided in the memory device to be formed by an LDD implanting technique.

Forming the isolating spacers represents a highly critical step of the process of fabricating devices with submicron technology. This step typically includes depositing a dielectric layer onto the entire memory device surface, once the gate electrodes of the memory cells and the circuitry transistors have been formed. This dielectric layer is then partially etched back to produce the isolating spacers on the side walls of the gate electrodes.

A problem with the deposition of this dielectric layer and the following layer of filler oxide between adjacent gate electrodes is the appearance of holes in the resulting layer.

These holes mostly form themselves in the interspaces between cells of the memory matrix, where the gate electrodes lie fairly close together.

The appearance of these holes is ascribed to the difficulty of finding dielectrics which can fill gaps having an ever higher aspect ratio and exhibiting side walls in contact with the gate electrodes which are given ever steeper profiles.

These holes are receptive of contaminants and impurities from subsequent processing operations, and in the instance of memory devices, ultimately degrade the electrical performance of the individual memory cells therein.

Until now, no process was capable of providing a method wherein the gaps between the gate electrodes can be filled in an optimum manner and circuitry isolating spacers formed in one process step, while including appropriate features to ensure protection of the substrate portion where the memory matrix is being formed, and to overcome the limitations of conventional processes.

SUMMARY OF THE INVENTION

Embodiments of this invention provide in a standard process flow for fabricating non-volatile memory matrices for depositing a first dielectric layer followed by etching back this first layer to form isolating spacers in the matrix, as well as depositing a second dielectric layer, followed by etching back this second layer to form isolating spacers in the circuitry.

Specifically, embodiments of the invention include a method of fabricating non-volatile memory devices integrated in a semiconductor substrate which include at least one matrix of non-volatile memory cells, each having at least one floating-gate MOS transistor provided with a respective gate electrode and control circuitry associated with the matrix including MOS transistors provided with respective gate electrodes. The method of this embodiment includes depositing a first dielectric layer onto the entire exposed surface, etching back the first dielectric layer to form isolating spacers on the side walls of the gate electrodes of the matrix cells, depositing a second dielectric layer onto the entire exposed surface, overlying the memory matrix with a protective layer, and etching back the second dielectric layer to form isolating spacers on the side walls of the gate electrodes of the circuitry transistors. Advantageously, the second dielectric layer is provided thinner than the first dielectric layer.

The invention relates, particularly but not exclusively, to a method of forming isolating spacers for memory cells of the EPROM or Flash EPROM type, and the description which follows will cover this field of application for convenience of explanation only.

DETAILED DESCRIPTION OF THE INVENTION

Figure 1:
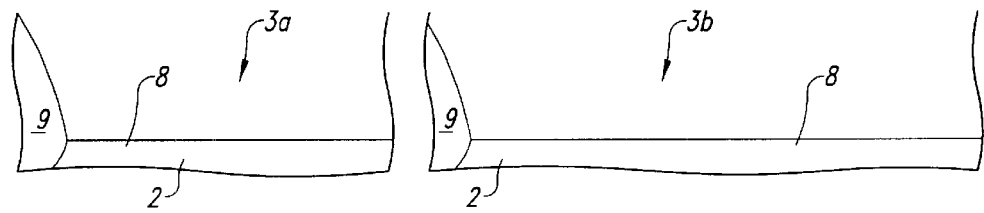
FIGS. 1 to 10 are vertical cross-sectional drawings, drawn to an enlarged scale, of a semiconductor substrate portion in the progress of a fabrication method according to embodiments of the invention.

An improved method of making electronic devices, specifically EPROM and Flash EPROM devices, integrated in a semiconductor substrate will be described with reference to the drawing views. The features and advantages of the methods according to embodiments of the invention can be appreciated from the following description of an embodiment thereof, given by way of non-limitative example with reference to the accompanying drawings.

The drawing figures show enlarged views in vertical cross-section of portions, not necessarily adjacent ones, of a semiconductor substrate wherein the memory devices of this invention are formed. Some process steps have been omitted from this description to avoid overburdening it with details of minor importance and well known to the skilled persons in the art.

The first step of the process for fabricating EPROM or Flash EPROM memory devices conventionally comprises providing active areas 8 of all the active elements, such as the floating-gate MOS transistors 3b of the cell matrix and the circuitry transistors 3b. (FIG. 1)

The active areas 8, being isolated from one another by insulating regions 9 of field oxide, are defined conventionally.

Figure 2:
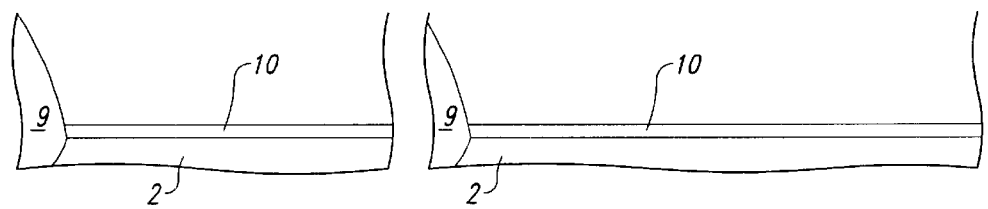

Subsequently to defining the active areas 8, a layer 10 of gate oxide can be grown to be used in forming the transistors 3a, 3b. FIG. 2)

Figure 3:
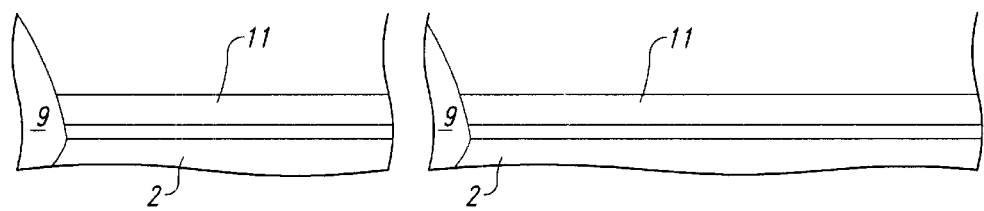

As shown in FIG. 3, a first conductive layer 11, e.g., of polysilicon, is then deposited.

A first mask of energy-sensitive material, e.g., a photoresist, provided to pattern the first polysilicon layer 11 and known in the art as the Poly1 mask (not shown), is used for defining floating gate electrodes 4a of the memory cells.

A photolithographic step is carried out conventionally to etch away the portions of the first polysilicon layer 11 that are unprotected by the Poly1 mask.

Figure 4:
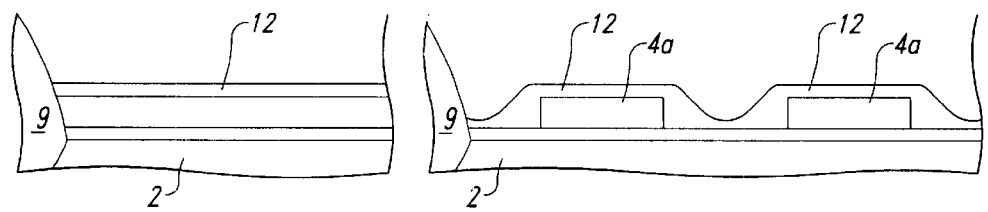

After removing the Poly1 mask, an intermediate dielectric layer 12, e.g. of ONO (Oxide-Nitride-Oxide), is deposited. (FIG. 4)

A second mask of energy-sensitive material, e.g., a photoresist, known in the art as the matrix mask (not shown), is used for masking off the semiconductor portion where the memory matrix is to be fabricated.

By application of a conventional photolithographic step, the first polysilicon layer 11 and intermediate dielectric layer 12 are etched away where unprotected by the matrix mask to again expose the gate oxide layer 10 at the circuitry portion of the semiconductor where the matrix is to be fabricated.

Figure 5:
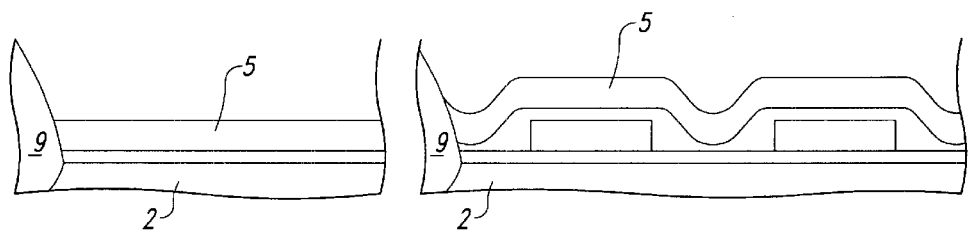

As shown in FIG. 5, the entire substrate is deposited with a second conductive layer 5, e.g., of polysilicon.

At this stage of the fabrication process, the control electrodes 4b and the cell matrix wordlines WL for driving the control electrodes of the memory cells in the same matrix column are defined.

A third mask of energy-sensitive material, such as a photoresist, for patterning the second polysilicon layer 5, and known in the art as the self-aligned etching mask (not shown), is used for defining the wordlines and cells of the cell matrix.

By application of a conventional photolithographic step, the second polysilicon layer 5 is etched away in the areas that are unprotected by the self-aligned etching mask.

Figure 6:
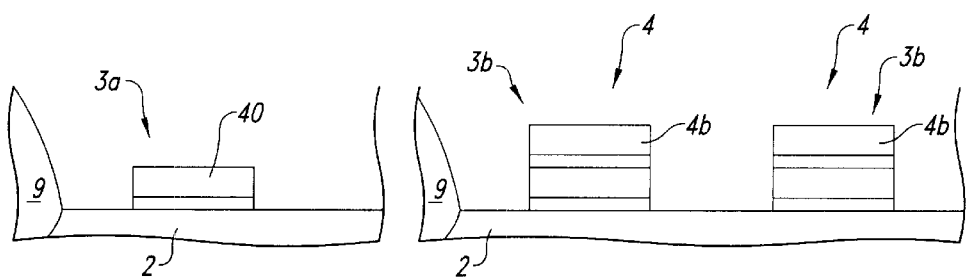

At this point, the floating gate electrodes 4 of the memory matrix cells and the circuitry gate electrodes 40 will have been formed, as shown in FIG. 6.

According to this embodiment of the invention, the process comprises now depositing a first dielectric layer 6 onto the entire surface of the substrate 2. For example, in a preferred embodiment, this dielectric layer 6 may be an oxide, e.g., tetraethylorthosilane (TEOS).

In an advantageous embodiment, the thickness of the dielectric layer is illustratively 2000 Å, which is adequate to mutually isolate the gate electrodes 4, 40 associated with the memory cells and those of the circuitry transistors.

Figure 7:
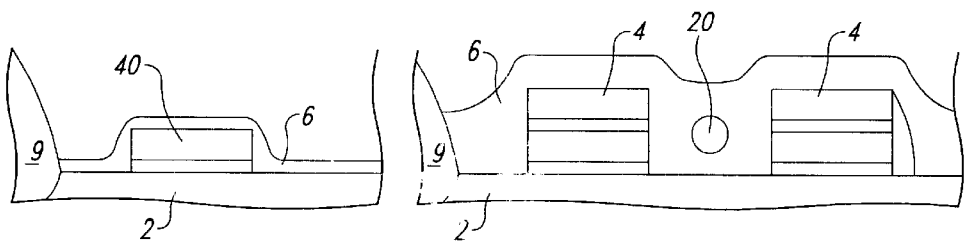
Figure 8:
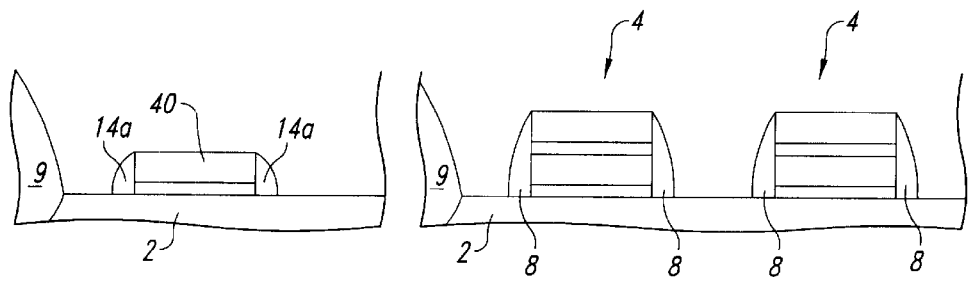

As shown in FIG. 7, when the gate electrodes 4 lie very close together in conventional constructions, the oxide layer 6 is likely develop holes 20. These holes can be a collection site of contaminants and impurities used in later process steps, as described above, and are therefore better to be eliminated. In the embodiment depicted, the dielectric layer 6 is etched back to leave isolating spacers 8 on the side walls of the matrix cell electrodes 4, as shown in FIG. 8.

During this etching step, carried out on the first dielectric layer 6, isolating spacers 14a are also formed temporarily on the side walls of the circuitry electrodes 40.

These temporary isolating spacers 14a are then completed during the following process steps.

At the end of this etching step, the gate electrodes 4 of the memory matrix, gate electrodes 40 of the circuitry, and matrix substrate outside the isolating spacers 8 will have been exposed by etching the dielectric layer.

This etching of the first dielectric layer may be a dry etch-back operation, for example.

Figure 9:
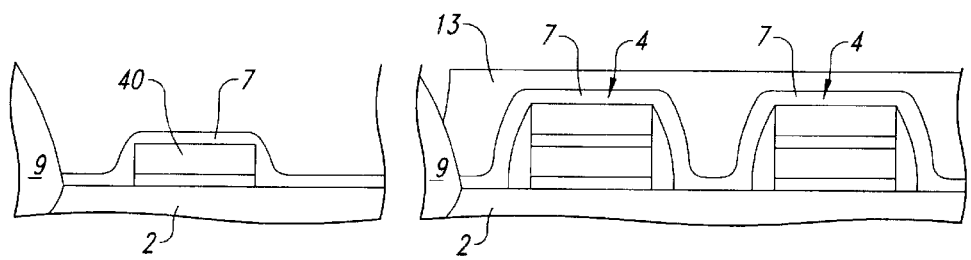
Figure 10:
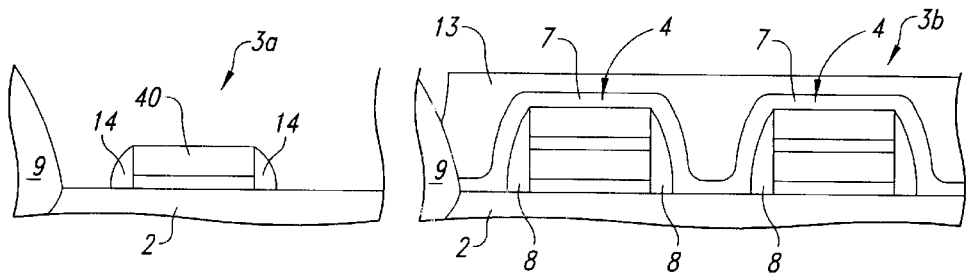

Thereafter, a second dielectric layer 7 is deposited onto the whole exposed surface. (FIG. 9) This second dielectric layer 7 may be an oxide such as tetraethylorthosilane (TEOS).

Advantageously, this second dielectric layer 7 may be thinner than the first layer 6. However, this second dielectric layer 7 could be thicker than the first layer 6, dependent on individual applications of the method.

Alternatively, this second dielectric layer may be provided by either HDPCVD (High Density Plasma Chemical Vapor Deposition) or SACVD (Sub-Atmospheric Chemical Vapor Deposition).

An additional mask 13 is used for protecting the semiconductor portion where the memory matrix is then formed. Advantageously, this mask 13 is the same as the matrix mask.

At this stage, the described method includes etching back the second dielectric layer 7, specifically by a dry etch-back operation.

This etch will only affect the circuitry, because of the matrix mask 13 which has been applied onto the memory matrix.

Thus, isolating spacers 14 are formed on the side walls of the circuitry electrodes, in the positions where the temporary spacers 14a once were.

To summarize, this described method results in a distribution of the dielectric layer over the matrix which facilitates the later deposition of pre-metal layers and prevents the formation of holes 10.

Furthermore, the method is advantageous especially with processes involving silicidation of the circuitry transistors 3a.

The mask 13 over the matrix makes silicidation of the matrix unnecessary, without introducing additional processing steps.

Thereafter, the process can be continued conventionally with the deposition of a transition metal, e.g., a titanium layer, which is then annealed to cause it to react selectively with the gate electrodes of the circuitry transistors and yield a layer of, for example, titanium silicide.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method of fabricating a non-volatile memory device integrated in a semiconductor substrate which include at least one matrix of non-volatile memory cells, each comprising at least one floating-gate MOS transistor having, a respective gate electrode, and the memory device including control circuitry associated with said at least one matrix and comprising MOS transistors having respective gate electrodes, the method comprising:

forming said gate electrodes above the substrate;

depositing a first dielectric layer onto a surface of the substrate exposed by forming said gate electrodes;

etching back said first dielectric layer without use of an etch mask to form isolating spacers on side walls of said gate electrodes of said memory cells;

depositing a second dielectric layer onto a surface of the substrate exposed by etching back said first dielectric layer, the depositing of the second dielectric layer to such a degree that at least a portion of the first dielectric layer is thicker than an adjacent portion of the second dielectric layer;

overlying said at least one memory matrix with a protective layer; and etching back said second dielectric layer to form isolating spacers on side walls of said gate electrodes of said MOS transistors in said control circuitry.

2. The method according to claim 1 wherein depositing a second dielectric layer comprises depositing a second dielectric layer that is thinner than said first dielectric layer.

3. The method according to claim 1, further comprising:

depositing a transition metal onto said MOS transistors in the control circuitry; and annealing the transition metal to cause it to react selectively with said gate electrodes of said MOS transistors in the control circuitry to yield a silicide layer.

4. The method according to claim 1 wherein depositing a first dielectric layer comprises depositing a TEOS layer.

5. The method according to claim 1 wherein depositing a first dielectric layer comprises depositing a TEOS layer that is 2000 Å thick.

6. The method according to claim 1 wherein etching back said first dielectric layer comprises dry etching said first dielectric layer.

7. The method according to claim 1 wherein depositing a second dielectric layer comprises depositing an oxide layer.

8. The method according to claim 1 wherein etching back said second dielectric layer comprises dry etching said second dielectric layer.

9. The method according to claim 2 wherein overlying said at least one memory matrix with a protective layer comprises using a matrix mask in forming a protective layer overlying said at least one memory matrix.

10. A method of fabricating a non-volatile memory device integrated in a semiconductor substrate, the method comprising:

forming a gate oxide layer disposed on first and second portions of the substrate;

forming a first conductive layer in the first and second portions of the substrate, the first conductive layer disposed on the gate oxide layer;

defining floating gate electrodes out of the first conductive layer in the first portion of the substrate;

forming an intermediate dielectric layer in the first and second portions of the substrate;

masking the first portion of the substrate with a matrix mask;

removing the first conductive layer and the intermediate dielectric layer from the second portion of the substrate to expose the gate oxide layer in the second portion of the substrate;

forming a second conductive layer in the first and second portions of the substrate;

patterning and etching the second conductive layer to form control gates in the first and second portions of the substrate;

forming a first dielectric layer disposed on the control gates and on the semiconductor substrate in the first and second portions of the substrate;

etching back the first dielectric layer in the first and second portions of the substrate without use of an etch mask to form, in the first portion, spacers on side walls of the control gates in the first portion of the substrate, and to form first spacers on side walls of the control gates of the second portion of the substrate;

forming a second dielectric layer onto the first and second portions of the substrate, portions of the second dielectric layer being thinner than adjacent portions of the first dielectric layer;

masking the first portion of the substrate with the matrix mask for a second time; and etching the second dielectric layer only in the first portion of the substrate to form second spacers on the side walls of the control gates in the first portion of the substrate.

11. The method of claim 10, further comprising:

depositing a transition metal onto the control gates in the second portion of the substrate; and annealing the transition metal to cause it to react selectively with the control gates in the second portion of the substrate to yield a silicide layer.

12. The method of claim 10 wherein forming a first dielectric layer comprises depositing a TEOS layer.

13. The method of claim 10 wherein forming a first dielectric layer comprises depositing a TEOS layer that is 2000 Å thick.

14. The method of claim 10 wherein etching back the first dielectric layer in the first and second portions of the substrate comprises dry etching the first dielectric layer.

15. The method of claim 10 wherein forming a second dielectric layer comprises depositing a layer of TEOS.

16. The method of claim 10 wherein removing the first conductive layer and the intermediate dielectric layer is performed by etching.

* * * * *